United States Patent [19]

Sato et al.

[11] Patent Number: 4,873,151

[45] Date of Patent: * Oct. 10, 1989

[54] ALUMINUM NITRIDE CIRCUIT SUBSTRATE

[75] Inventors: Hideki Sato; Nobuyuki Mizunoya, both of Yokohama, Japan

[73] Assignee: Kabushiki Kaisha Toshiba, Kawasaki, Japan

[ * ] Notice: The portion of the term of this patent subsequent to Aug. 2, 2005 has been disclaimed.

[21] Appl. No.: 71,132

[22] Filed: Jul. 8, 1987

[30] Foreign Application Priority Data

Jul. 11, 1986 [JP] Japan ................. 61-161784

[51] Int. Cl.$^4$ ............................................ B32B 15/04
[52] U.S. Cl. ..................................... 428/627; 428/662; 428/663; 428/665; 428/674; 428/680; 428/901; 357/71
[58] Field of Search ............... 428/620, 627, 632, 662, 428/663, 665, 674, 680, 901; 357/67, 71

[56] References Cited

U.S. PATENT DOCUMENTS

| | | | |
|---|---|---|---|
| 3,864,727 | 2/1975 | Schoberl | 357/65 |
| 4,042,952 | 8/1977 | Kraybill | 357/68 |
| 4,246,697 | 1/1981 | Smith | 29/827 |
| 4,480,013 | 10/1984 | Doi et al. | 428/616 |
| 4,540,673 | 9/1985 | Takeda et al. | 501/96 |
| 4,761,345 | 8/1988 | Sato et al. | 428/627 |
| 4,770,953 | 9/1988 | Horiguchi et al. | 428/901 |

FOREIGN PATENT DOCUMENTS 1914442  1/1971  Fed. Rep. of Germany .
1264055  2/1972  United Kingdom .

OTHER PUBLICATIONS

Hisaharu Sakurai, Patent Abstracts of Japan, "Semiconductor Device", vol. 8, No. 127 (E-250) [1564], June 14, 1984.
Tetsuo Fujiwara, Patent Abstracts of Japan, "Lead Frame", vol. 9, No. 3 (M-349) [1726], Jan. 9, 1985.
Yoshio Shinoda, Patent Abstracts of Japan, "Lead Frame Member for Semiconductor Integrated Circuit", vol. 9, No. 61 (E-303) [1784], Mar. 19, 1985.
W. Werdecker, 35th Electronic Components Conference, "High Performance aluminum nitride substrate by tape casting technology", pp. 26-31, IEEE, May 20-22, 1985.
H. Takashio "Alumina Ceramic-to-Metal Seals by the Mo-Mn Process" Yogyo-Kyokai-Shi, 79(9)1971, pp. 330-339.

*Primary Examiner*—L. Dewayne Rutledge
*Assistant Examiner*—George Wyszomierski
*Attorney, Agent, or Firm*—Foley & Lardner, Schwartz, Jeffery, Schwaab, Mack, Blumenthal & Evans

[57] ABSTRACT

Disclosed is an aluminum nitride circuit substrate comprising an aluminum nitride plate and a conductive material bonded to the aluminum nitride plate through a metallized layer formed on the bonding surface of the aluminum nitride plate, the conductive material being of a metallic material which has a thermal expansion coefficient of $2 \times 10^{-6}$ to $6 \times 10^{-6}$/°C.

The aluminum nitride circuit substrate according to this invention is free from the generation of crack caused by the difference of the thermal expansion coefficients of AlN plate and a conductive material bonded to the AlN plate to improve the reliability of the elements.

17 Claims, 1 Drawing Sheet

ALUMINUM NITRIDE CIRCUIT SUBSTRATE

BACKGROUND OF THE INVENTION

This invention relates to an aluminum nitride circuit substrate, more particularly, to an aluminum nitride circuit substrate being free from generation of cracks due to, for example, a large bonding area between a lead frame and a substrate.

In the prior art, as a circuit substrate for a semiconductor, there has been generally employed an inexpensive alumina ($Al_2O_3$) substrate, on which a circuit is formed and various elements including a semiconductor device are mounted on the circuit.

However, in recent years, with the tendency that the semiconductor device have increase output, a heat release value of such devices become higher. Therefore, as a result the above-mentioned $Al_2O_3$ substrate is not necessarily sufficient in the point of the heat dissipating characteristic. Also, with the above tendency, a lead frame has become larger in size.

For this reason, the present inventors have tried to obtain a circuit substrate employing an aluminum nitride (AlN), having an excellent heat dissipating characteristic instead of $Al_2O_3$. However, the circuit substrate of AlN tends to cause the following new problem. That is, on a predetermined position of a surface of the circuit substrate, the so-called lead frame functioning as an electrode as well is bonded. In the prior art, a conventional metallized layer is formed on a surface of the $Al_2O_3$ substrate and then an electroconductive substance to be used as the lead frame is bonded through the metallized layer. In this case, Fe-Ni-Co alloy has been used for hermetic sealing from a viewpoint of readiness in soldering property.

However, in such an AlN circuit substrate prepared by forming the conventional metallized layer on the surface of the AlN circuit substrate and bonding the lead frame, sometimes the generation of cracks is observed at the bonded portion with the increase of a temperature.

SUMMARY OF THE INVENTION

An object of this invention is to solve such problems in the prior art and to provide an AlN circuit substrate to which a lead frame is bonded and which is free from generation of cracks at the bonded portion.

The present inventors have achieved the above-mentioned object and by discovering that the cracks are formed by the difference between the thermal expansion coefficient of the AlN substrate and that of the lead frame and that the generation of cracks may be prevented by employing a metallic material having a thermal expansion coefficient similar to that of AlN.

More specifically, the aluminum nitride circuit substrate of this invention is an aluminum nitride circuit substrate comprising an aluminum nitride plate and a conductive material bonded to said aluminum nitride plate through a metallized layer formed on the bonding surface of the aluminum nitride plate, said conductive material being of a metallic material which has a thermal expansion coefficient of $2 \times 10^{-6}$ to $6 \times 10^{-6}/°C$.

DESCRIPTION OF THE PREFERRED EMBODIMENTS

The circuit substrate of this invention is characterized by the conductive material constituting the lead frame as described above, and not limited in shape or form.

Figure 1:
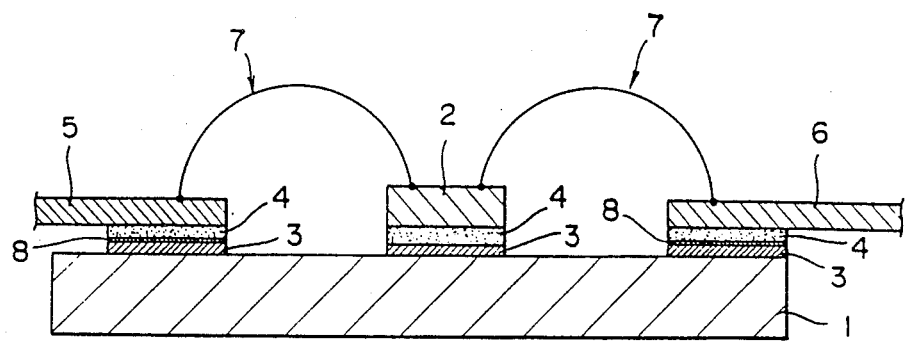
FIG. 1 is a cross-sectional view showing an example of the structure of the aluminum nitride circuit substrate of this invention.

Hereinbelow, the construction of the AlN circuit substrate of this invention will be explained with reference to the drawings. FIG. 1 is a cross-sectional view of the substrate when this invention is applied to a flat package. In FIG. 1, a semiconductor element 2 being made of, for example, Si is provided to a predetermined portion of a surface of the AlN plate 1. The Si semiconductor element 2 is bonded to the plate 1 through a metallized layer 3 and a soldering layer 4. The metallized layer may be constituted of molybdenum (Mo), tungsten (W), etc. and is formed by employing the conventional metallizing method as described in "Alumina Ceramic-to-Metal Seals by the Mo-Mn Process", Yogyo-Kyokai-Shi, 79(9)1971, pp 330-339, H. TAKASHIO, etc.

Also, as the soldering material, there may be employed the conventional soldering material such as a silver solder and an ordinary solder. Incidentally, since Si has a substantially same thermal expansion coefficient as that of AlN, it is not particularly necessary to provide a buffering layer between Si and AlN plates.

In FIG. 1, conductive materials, namely, lead frames 5 and 6 are bonded to the both end portions of the plate 1 through a metallized layer 3 and a soldering layer 4 similarly as in the case of the Si element 2. The material constituting the lead frames 5 and 6 is required to have a thermal expansion coefficient substantially similar to that of AlN ($4.6 \times 10^{-6}/°C$.) as mentioned above. Specifically, it is generally in the range of $2 \times 10^{-6}$ to $6 \times 10^{-6}/°C$., preferably $4 \times 10^{-6}$ to $5 \times 10^{-6}/°C$. In addition to the above requirement, the conductive material may preferably have a higher thermal conductivity (preferably not less than 50 W/m.k) and a lower electrical resistance. As the specific examples of such a conductive material, there may be mentioned, for example, molybdenum (Mo); tungsten (W); a molybdenum series alloy such as Co-Sn added molybdenum, doped molybdenum (containing K, Si and alumina in the sum total of not more than 0.5%); a tungsten series alloy such as doped tungsten (containing a slight amount of Al, Si and K) and thoriated tungsten (containing $ThO_2$ in the range of 0.5 to 1.5% by weight); a nickel series alloy such as an Invar steel (containing 34 to 37% of Ni) and a Fe-Ni alloy (trade name: "NSD" produced by Toshiba K.K., containing 42% Ni and having a thermal expansion coefficient of $5 \times 10^{-6}$); a chromium series alloy; a copper series alloy such as phosphor bronze, beryllium copper, brass; copper; a clad metal of an Fe-Ni-Co alloy for hermetic sealing and copper (e.g. KOV-Cu clad metal; "KOV" is a trade name of Toshiba K.K.); a Mo-Cu clad metal; a W-Cu clad metal; etc. Among them, particularly preferred is molybdenum.

As the metallized layer on the AlN plate, preferably employed is a conductive metallized layer containing:

(i) at least one of element selected from the first group consisting of molybdenum, tungsten and tantalum; and (ii) at least one element selected from the second group consisting of IIb group elements, IIIa and IIIb group elements, IVb group elements, rare-earth elements, and actinide elements in periodic law table.

In the above elements of the conductive metallized layer, the elements belonging to the first group of molybdenum (Mo), tungsten (W) and tantalum (Ta) are excellent in heat resistance and further approximate to the AlN material in thermal expansion coefficient, so that these elements serve to improve the heat resistance characteristics and the cyclic heat resistance characteristics.

These elements are included in a filler of the metallized layer as a single element or a combination of two or more elements. In more detail, these elements belonging to the first group exist in the metallized layer in the form of each element, a compound or solid solution including each element, or a mixture of two or more elements selected from the group consisting of these elements, compounds and solid solutions. The compounds are oxides, nitrides, carbides, acid nitrides, carbonic nitrides, carbonic oxides, carbonic acid nitrides, borides, silicides, etc. of these elements. In addition to the above-mentioned elements, these compounds can be composite compounds or solid solutions which include at least one of the elements belonging to the second group (described later) and/or at least one of elements other than those belonging to the second group.

That is when taking the case of Mo as the element, Mo exists in the conductive metallized layer in the form of Mo or Mo-Al solid solution.

Further, in the elements of the conductive metallized layer, the elements belonging to the second group of the IIIA group elements (B, Al, Ga, In, Tl), the IVb group elements (Ti, Zr, Hf), IIIb group elements (Sc, Y, Te), the rare earth elements (Y, La, Ce, Pr, Nd, Pm, Sm, Eu, Gd, Tb, Dy, Ho, Er, Tm, Yb, Lu) and the actinide (Ac, Th, Pa, U, Np, Pu, Am, Cm, Bk, Cf, Es, Fm, Md, No, Lr) are excellent in wetness relative to AlN, so that these elements serve to improve the adhesion between the conductive metallized layer and the AlN plate. Further, Al, Ti, Zr, Hf, Y, Ce, Dy, Th, Sm are particularly preferable as the elements belonging to the second group.

In the same way as in the elements belonging to the first group, these elements belonging to the second group are included in the metallized layer in the form of a single element or a mixture of two or more elements. That is, these elements exist in the metallized layer in the form of each element, a compound or solid solution including each element or a mixture of two or more elements selected from the group consisting of these elements, compounds and solid solutions.

In the case of Ti as the component phase, Ti exists in the conductive metallized layer in the form of TiN, $TiO_2$, etc.

In this invention, the composition ratio of elements belonging to the first group and those belonging to the second group is not defined specifically. The ratio is appropriately determined according to the kind of elements used or the combination. For instance, it is preferable that the ratio of the sum total of the elements belonging to the first group to that of the elements belonging to the second group is 90:10 to 10:90 in atomic ratio.

Incidentally, as the AlN substrate, those having a thermal expansion coefficient of not less than 50 W/m.k for exhibiting a heat release are sufficient.

It is effective to apply this invention to the following case. That is, in the case of employing a plate-like lead frame, not a pin-type, since an area to be bonded is large, the difference between their thermal expansion coefficients causes a problem. For solving such a problem, the conductive material of this invention may preferably be employed. In this case, this invention is effective when the area is not less than 4 $mm^2$, preferably 8 $mm^2$, more preferably 16 $mm^2$.

Also, in the case of employing the plate-like lead frame, it is possible to provide a Si plate on the lead frame and further provide various elements on the Si plate, and therefore the present invention can contribute to the development of a circuit substrate having larger capacity.

Figure 2:
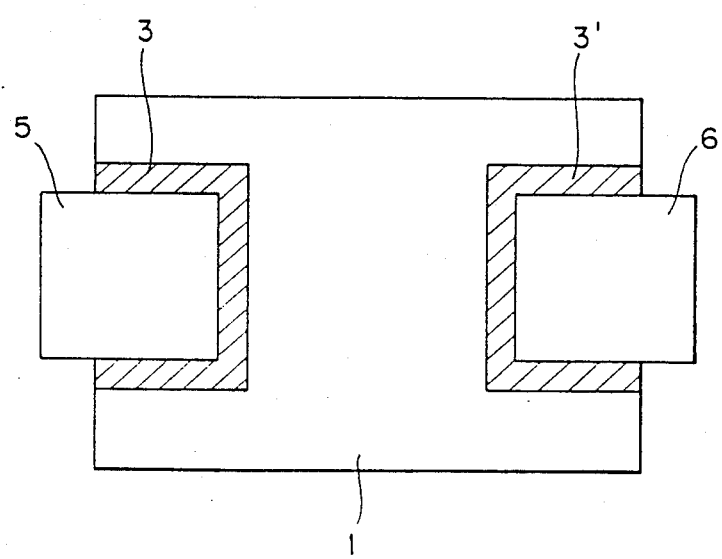
FIG. 2 is a plan view of an embodiment of this invention employing a plate-like lead frame.

In FIG. 2, plate-like lead frame 5 is bonded to the AlN plate through a metallized layer, a plating layer and a metallized layer 3 in this order viewed from the lead frame 5.

EXAMPLE 1

A circuit substrate for a flat package shown in FIG. 1 was prepared. That is, the circuit substrate was prepared by employing an AlN plate having a thermal conductivity of 100 W/m.k as an AlN plate 1, providing a metallized layer 3 made of molybdenum at the predetermined portion on the AlN plate 1, providing a plating layer 8 on the metallized layer 3, forming a silver solder layer 4 made of silver-copper alloy, and then bonding a Si pellet element 2 and lead frames 5 and 6 to the AlN plate. The bonding area on which the lead frames were bonded was 16 $mm^2$, respectively. As the material for the lead frames 5 and 6, molybdenum having a thermal expansion coefficient of $5.1 \times 10^{-6}/°C$. was used. Then, the whole body of the circuit substrate was hermetically sealed to produce a flat package.

Observations were made on 100 bodies of the resulting packages to find that no one caused any generation of crack on the bonded portion of the AlN plate to which the lead frames 5 and 6 were bonded.

For comparison, the circuit substrates and packages were prepared in the same manner as in the above except for employing a Fe-Ni-Co alloy (having a thermal expansion coefficient of $7.0 \times 10^{-6}/°C$.) as the lead frames 5 and 6, and the same observation test was made on these packages to find the generation of cracks on 80 bodies among 100 bodies.

EXAMPLE 2

The circuit substrate as shown in FIG. 2 was prepared in the following manner. That is, on the predetermined portion of the AlN plate 1 of 12.7 mm × 12.7 mm having a thermal conductivity of 150 W/m.k, provided were a metallized layer made of molybenum, a nickel plating layer on the metallized layer and a silver solder layer made of a silver-copper alloy on the plating layer. Then, lead frames 5 and 6 of 3.0 mm × 3.4 mm were bonded to the AlN plate. The bonding area on which the lead frames were bonded was 4 $mm^2$, respectively. As the material for the lead frames 5 and 6, molybdenum having a thermal expansion coefficient of $5.1 \times 10^{-6}/°C$. was used. Then, the whole body of the circuit substrate was hermetically sealed to produce a flat package.

For comparison, a flat package was prepared in the same manner as in the above except for employing a lead frame of a Fe-Ni-Co alloy having a thermal expansion coefficient of $7.0 \times 10^{-6}/°C$.

The same observation test as in Example 1 and a tensile strength test were conducted immediately after the preparation of these packages, after 200 cycles of TCT (Thermal Cycle Test) by setting $-50°C. \times 0.5$ hour and $125° C. \times 0.5$ hours as one cycle and after 500 cycles of TCT as in the above. The tensile strength test was conducted in a manner that a pin made of KOVAR (trade name; produced by Toshiba K.K.; Ni-Co-Fe alloy) was provided on the lead frame by soldering and a tensile strength was applied to the pin by use of a pullgauge in the vertical direction.

The results are also shown in Table 1 by indicating the number of circuit substrates which caused generation of cracks per 100 bodies and showed an average tensile strength per 10 bodies.

TABLE 1

| Kind of material for lead frame | Evaluation at the initial stage | | After 200 cycles of TCT | | After 500 cycles of TCT | |
|---|---|---|---|---|---|---|
| | Number of cracks | Tensile strength (kg·f/mm$^2$) | Number of cracks | Tensile strength (kg·f/mm$^2$) | Number of cracks | Tensile strength (kg·f/mm$^2$) |
| Mo | 0 | 3 | 0 | 3 | 0 | 3 |
| Fe—Ni—Co | 43 | 2 | 68 | 1.4 | 79 | 1.1 |

EXAMPLE 3

Using the same metallic materials as in Example 2, the following experiments were made.

(1) Two kinds of pins made of Mo and Fe-Ni-Co alloy, respectively, were bonded to a surface of the AlN plate through a metallized layer. Both of them were revealed to have caused no generation of cracks at the bonded portion.

(2) Two kinds of narrow plates made of Mo and Fe-Ni-Co alloy, respectively, were bonded to a surface of the AlN plate through a metallized layer in the bonded area of less than 4 mm$^2$. Both of them were revealed to have caused no generation of cracks at the bonded portion.

(3) The same packages were prepared as in Example 2 except for employing KOV (trade name; produced by Toshiba K.K.; Ni 29%, Co 17% and Fe as a balance) and molybdenum and varying the bonding area in 3 mm$^2$, 6 mm$^2$ and 10 mm$^2$. Immediately after the preparation of the packages, an observation test was made. The results are shown in Table 2 by indicating the number of packages which was revealed to have caused generation of cracks per 10 bodies of the packages.

TABLE 2

| Kind of material for lead frame | 3 mm$^2$ of bonding area | 6 mm$^2$ of bonding area | 10 mm$^2$ of bonding area |
|---|---|---|---|
| KOV | 0 | 3 | 7 |
| Mo | 0 | 0 | 0 |

EXAMPLE 4

The flat packages were prepared in the same manner as in Example 2 except for forming a metallized layer of a Mo-TiN alloy (the ratio of Mo:TiN is 2:1) on the AlN plate at a temperature of 1,700° C. in an atmosphere of nitrogen for 1 hour and forming a nickel electroless plating.

On the other hand, the same packages were prepared as in the above except for forming a metallized layer of a Mo-Mn alloy containing 8% of Mn at a temperature of 1,500° C. in an atmosphere of wet N-H$_2$ gas for 1 hour on the AlN plate.

There was no difference between these packages in appearance. However, a tensile strength of the package employing the Mo-Mn alloy was as little as about 1 kg.f/mm$^2$ and all the packages employing the Mo-Mn alloy were revealed to cause generation of cracks or peeling off at the metallized layer after 200 cycles of TCT as conducted in Example 2.

As will be clear from the above-mentioned, the aluminum nitride circuit substrate of this invention is, in addition to having an excellent heat dissipating characteristic, free from the generation of crack, because, for example, since a conductive material such as a lead frame is constituted of a metallic material having a thermal expansion coefficient substantially similar to that of aluminum nitride, an excessive stress is not applied to the circuit substrate if the temperature of the circuit substrate in raised by heat developed in an element is use. Accordingly, reliability of the circuit substrate is very much improved and its industrial value becomes greater.

We claim:

1. An aluminum nitride circuit substrate comprising: an aluminum nitride plate comprising a bonding surface; and
a conductive material having a thermal expansion coefficient substantially similar to that of AlN bonded to said aluminum nitride plate through a metallized layer formed on the bonding surface of the aluminum nitride plate, said conductive material being of a metallic material which has a thermal expansion coefficient of $2 \times 10^{-6}$ to $6 \times 10^{-6}$/°C.

2. The aluminum nitride circuit substrate according to claim 1, wherein said thermal expansion coefficient is in the range of $4 \times 10^{-6}$ to $5 \times 10^{-6}$/°C.

3. The aluminum nitride circuit substrate according to claim 1, wherein said conductive material is a plate-like lead frame.

4. The aluminum nitride circuit substrate according to claim 3, wherein the bonding area of the aluminum nitride and the lead frame is not less than 4 mm$^2$.

5. The aluminum nitride circuit substrate according to claim 4, wherein the bonding area of the aluminum nitride and the lead frame is not less than 8 mm$^2$.

6. The aluminum nitride circuit substrate according to claim 5, wherein the bonding area of the aluminum nitride and the lead frame is not less than 16 mm$^2$.

7. The aluminum nitride circuit substrate according to claim 1, wherein said metallized layer is selected from the group consisting of molybdenum and tungsten.

8. The aluminum nitride circuit substrate according to claim 1, wherein said conductive material is at least one selected from the group consisting of molybdenum, tungsten, a molybdenum series alloy, a tungsten series alloy, a nickel series alloy, a chromium series alloy, a copper series alloy, copper, a clad metal of an Fe-Ni-Co alloy for hermetic sealing and copper, a Mo-Cu clad metal and a W-Cu clad metal.

9. The aluminum nitride circuit substrate according to claim 8, wherein said conductive material is molybdenum.

10. The aluminum nitride circuit substrate according to claim 8, wherein said conductive material is Invar steel.

11. The aluminum nitride circuit substrate according to claim 1, wherein said metallized layer is a conductive metallized layer containing:
(i) at least one element selected from the first group consisting of molybdenum, tungsten and tantalum; and
(ii) at least one element selected from the second group consisting of IIb group element, IIIa and IIIb group elements, IVb group elements, and rare-earth elements in periodic law table.

12. The aluminum nitride circuit substrate according to claim 11, wherein said second group consists of said IIb group elements.

13. The aluminum nitride circuit substrate according to claim 11, wherein said second group consists of said IIIa and IIIb group elements.

14. The aluminum nitride circuit substrate according to claim 11, wherein said second group consists of said rare earth group elements.

15. The aluminum nitride circuit substrate according to claim 11, wherein said second group consists of said IVb group elements.

16. The aluminum nitride circuit substrate according to claim 11, wherein component (ii) is selected from the group consisting of Al, Ti, Zr, Hf, Y, Ce, Dy, Th and Sm.

17. The aluminum nitride circuit substrate according to claim 1, wherein the conductive material is a lead frame.

* * * * *